(12) United States Patent
Cheon

(10) Patent No.: US 10,135,421 B2
(45) Date of Patent: Nov. 20, 2018

(54) BULK-ACOUSTIC WAVE FILTER DEVICE

(71) Applicant: Samsung Electro-Mechanics Co., Ltd., Suwon-si (KR)

(72) Inventor: Seong Jong Cheon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 36 days.

(21) Appl. No.: 15/481,013

(22) Filed: Apr. 6, 2017

(65) Prior Publication Data

US 2018/0048291 A1  Feb. 15, 2018

(30) Foreign Application Priority Data

Aug. 11, 2016 (KR) .................. 10-2016-0102557

(51) Int. Cl.
*H03H 9/54* (2006.01)
*H03H 9/58* (2006.01)
*H03H 3/02* (2006.01)
*H03H 9/05* (2006.01)

(52) U.S. Cl.
CPC .............. *H03H 9/542* (2013.01); *H03H 3/02* (2013.01); *H03H 9/0547* (2013.01); *H03H 2003/021* (2013.01); *H05K 999/99* (2013.01)

(58) Field of Classification Search
CPC ..... H03H 9/542; H03H 3/02; H03H 2003/021
USPC ........................................................ 333/189
See application file for complete search history.

(56) References Cited

U.S. PATENT DOCUMENTS

| 2007/0069835 A1* | 3/2007 | Kamgaing ............... H03H 5/02 |
| | | 333/185 |
| 2011/0090651 A1 | 4/2011 | Jung et al. |
| 2012/0049978 A1* | 3/2012 | Pang ................... H03H 9/0547 |
| | | 333/189 |
| 2015/0188512 A1 | 7/2015 | Michigami |

FOREIGN PATENT DOCUMENTS

| JP | 9-93077 A | 4/1997 |
| JP | 2007-67617 A | 3/2007 |
| JP | 2008-252065 A | 10/2008 |
| KR | 10-2005-0073312 A | 7/2005 |
| KR | 10-2006-0102419 A | 9/2006 |
| KR | 10-2007-0016855 A | 2/2007 |
| KR | 10-2011-0041179 A | 4/2011 |
| KR | 10-2015-0047572 A | 5/2015 |
| KR | 10-2015-0049344 A | 5/2015 |

* cited by examiner

*Primary Examiner* — Stephen E Jones
*Assistant Examiner* — Scott S Outten
(74) *Attorney, Agent, or Firm* — NSIP Law

(57) ABSTRACT

A bulk-acoustic wave filter device includes: a first substrate; a first filter disposed on the first substrate, within a cavity of the bulk-acoustic wave filter device; a second substrate coupled to the first substrate; a second filter disposed on the second substrate, within the cavity and facing the first filter; a first inductor layer disposed on the first substrate and around the first filter; a second inductor layer disposed on the second substrate and around the second filter, and bonded to the first inductor layer; and a sealing member sealing the cavity, together with the first and second inductor layers.

18 Claims, 5 Drawing Sheets

BULK-ACOUSTIC WAVE FILTER DEVICE

CROSS-REFERENCE TO RELATED APPLICATIONS

This application claims the benefit under 35 U.S.C. § 119(a) of Korean Patent Application No. 10-2016-0102557 filed on Aug. 11, 2016, in the Korean Intellectual Property Office, the entire disclosure of which is incorporated herein by reference for all purposes.

BACKGROUND

1. Field

The following description relates to a bulk-acoustic wave filter device.

2. Description of Related Art

Bulk acoustic wave (BAW) duplexers may include BAW filters for transmission and reception that are respectively surface mounted on a multilayer substrate, and an auxiliary circuit implemented using the multilayer substrate. Since the BAW filters may be two-dimensionally surface-mounted on the multilayer substrate, there may be limitations in terms of space minimization.

In addition, as the thickness of an RF front-end module is reduced, the thickness of a BAW duplexer also needs to be reduced. For this reason, a thin multilayer substrate needs to be implemented. When an inductor is formed on a thin multilayer substrate, a height from a ground plane may be relatively low, and therefore, a quality factor (Q) of an inductor required to form a BAW duplexer may also be low, which may lead to an increase in insertion loss.

Further, when performing wafer level packaging (WLP) on the BAW duplexer, the BAW duplexer may be sealed through the application of an adhesive material to form a bonded part between wafers and melting of the adhesive material. However, the permeation of moisture or other contaminants into the BAW duplexer may not be entirely blocked.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave filter device includes: a first substrate; a first filter disposed on the first substrate, within a cavity of the bulk-acoustic wave filter device; a second substrate coupled to the first substrate; a second filter disposed on the second substrate, within the cavity and facing the first filter; a first inductor layer disposed on the first substrate and around the first filter; a second inductor layer disposed on the second substrate and around the second filter, and bonded to the first inductor layer; and a sealing member sealing the cavity, together with the first and second inductor layers.

The first and second inductor layers may have spiral shapes corresponding to each other.

The sealing member may be formed in an open area of the first and second inductor layers.

The sealing member may include a polysilicon material.

A thickness of the first and second inductor layers may be greater than a width of the first and second inductor layers.

The first and second substrates may include etched grooves disposed around the first and second inductor layers.

The etched grooves may be formed by reactive ion etching (RIE).

The first and second inductor layers may include either one of copper and nickel, and may be formed by plating.

The first and second inductor layers may be bonded to each other by eutectic bonding.

The bulk-acoustic wave filter device may further include a connection pad disposed on a bottom surface of the first substrate and connected to a via.

The first and second substrates may include auxiliary layers on which the first and second inductor layers and the sealing member are formed.

The sealing member may be disposed on portions of the auxiliary layers on which the first and second inductor layers are not formed.

The bulk-acoustic wave filter device may further include: a first bonding layer disposed on the first substrate, outside of the first inductor layer; and a second bonding layer disposed on the second substrate and bonded to the first bonding layer.

In another general aspect, a bulk-acoustic wave filter device includes: a first substrate; a first filter disposed on the first substrate, within a cavity of the bulk-acoustic wave filter device; a second substrate coupled to the first substrate; a second filter disposed on the second substrate, within the cavity and facing the first filter; an inductor having a spiral shape and including first and second inductor layers enclosing the first and second filters; and a sealing member sealing a portion of the inductor so as to seal the cavity.

The first and second substrates may include etched grooves disposed around the first and second inductor layers.

A thickness of the first and second inductor layers may be greater than a width of the first and second inductor layers.

The sealing member may include a polysilicon material.

The inductor and the sealing member may be bonded to the first and second substrates.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
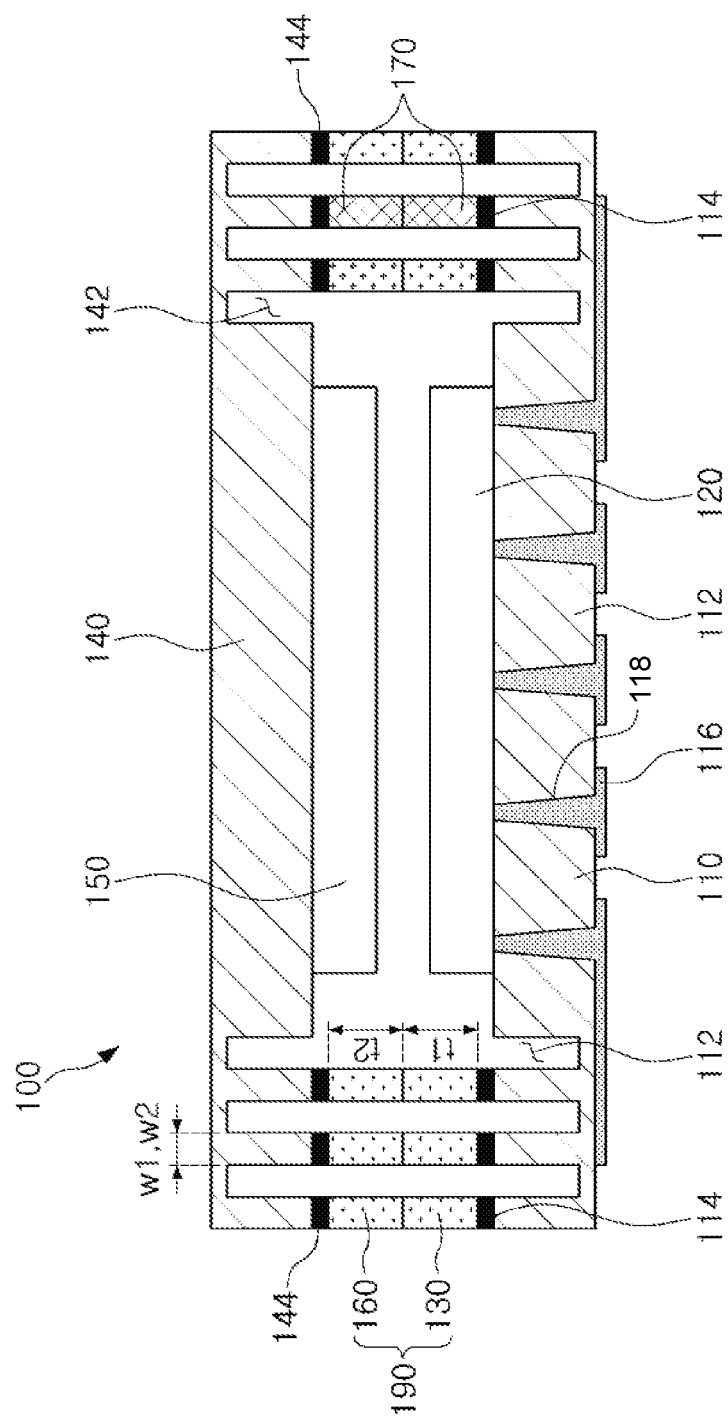
FIG. 1 is a schematic cross-sectional view illustrating a bulk-acoustic wave filter device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
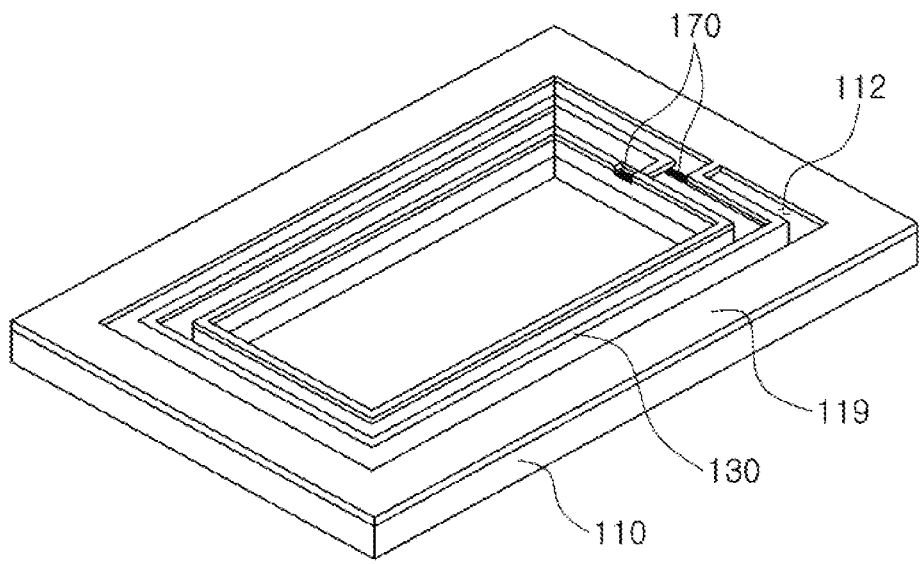
FIG. 2 is a view illustrating a first inductor layer of the bulk-acoustic wave filter device of FIG. 1.

FIG. 1 is a schematic cross-sectional view illustrating a bulk-acoustic wave filter device 100, according to an embodiment. FIG. 2 is a view illustrating a first inductor layer 130 of the bulk-acoustic wave filter device 100.

Referring to FIGS. 1 and 2, the bulk-acoustic wave filter device 100 includes, for example, a first substrate 110, a first filter 120, a first inductor layer 130, a second substrate 140, a second filter 150, a second inductor layer 160, and a sealing member 170.

The first substrate 110 may be a substrate in which silicon is stacked. For example, the first substrate 110 is formed of a silicon wafer.

The first substrate 110 includes etched grooves 112 disposed around the first inductor layer 130. The etched grooves 112 may be formed by reactive ion etching (RIE). As an example, the etched grooves 112 are formed on the first substrate 110 by deep trench reactive ion etching.

The first substrate 110 includes an auxiliary layer 114 on which the first inductor layer 130 and the sealing member 170 are formed. The auxiliary layer 114 is an auxiliary bonding layer that allows the first inductor layer 130 and the sealing member 170 to be more easily bonded to the first substrate 110. As an example, the auxiliary layer 114 is formed of a metal material.

In addition, a connection pad 116 is formed on a bottom surface of the first substrate 110, and is connected to a via 118.

The first filter 120 is formed on the first substrate 110 in an inner space, or cavity, of the bulk-acoustic wave filter device 100. The first filter 120 includes, for example, a lower electrode (not shown), a piezoelectric layer (not shown), and an upper electrode (not shown). The lower electrode, the piezoelectric layer, and the upper electrode may be sequentially stacked. Further, the first filter 120 may include an air gap.

The lower electrode and the upper electrode included in the first filter 120 may be formed of a conductive material such as molybdenum (Mo), ruthenium (Ru), or tungsten (W).

Further, the lower electrode and the upper electrode included in the first filter 120 are used as an input electrode and an output electrode for applying electrical signals, such as RF signals, to the piezoelectric layer. For example, when the lower electrode is the input electrode, the upper electrode is the output electrode.

Further, the piezoelectric layer converts the electrical signal input from the lower electrode or the upper electrode into an acoustic wave.

For example, when an electric field varying over time is induced into the lower electrode, the piezoelectric layer converts the electrical signal input to the lower electrode into physical vibrations. That is, when the electric field varying over time is induced into the lower electrode, the piezoelectric layer generates a bulk acoustic wave oriented in the thickness direction of the piezoelectric layer using the induced electric field. Thus, the piezoelectric layer generates the bulk acoustic wave from the electrical signal.

The piezoelectric layer may be formed by depositing aluminum nitride, zinc oxide, or lead zirconate titanate on the lower electrode.

The first inductor layer 130 is formed on the first substrate 110 so as to be disposed around the first filter 120. The first inductor layer 130 may be formed of either of copper (Cu) or nickel (Ni), and may be formed by plating. For example, the first inductor layer 130 is disposed outside of the first filter 120.

In addition, the first inductor layer 130 has a high aspect ratio. That is, a thickness t1 of the first inductor layer 130 is greater than a width w1 of the first inductor layer 130.

Further, the first inductor layer 130 has a spiral shape. For example, the first inductor layer 130 has a shape corresponding to a shape of the first filter 120. For example, when the first filter 120 has a substantially amorphous circular or oval shape, the first inductor layer 130 has a substantially amorphous circular or oval shape. As another example, when the first filter 120 has a substantially polygonal shape (e.g., a pentagon, or a quadrangle), the first inductor layer 130 also has a substantially polygonal shape.

Due to the first inductor layer 130 having the spiral shape, the first inductor layer 130 is not shaped to seal the inner space of the bulk-acoustic wave filter device 100.

The second substrate 140 is coupled to the first substrate 110, and is disposed above the first substrate 110. That is, the first and second substrates 110 and 140 are disposed to face each other. The second substrate 140 may be a substrate in which silicon is stacked. For example, the second substrate 140 is formed of a silicon wafer.

Further, the second substrate 140 includes etched grooves 142 disposed around the second inductor layer 160. The etched grooves 142 may be formed by reactive ion etching (RIE). For example, the etched grooves 142 are formed in the second substrate 140 by deep trench reactive ion etching.

The second substrate 140 includes an auxiliary layer 144 on which the second inductor layer 160 and the sealing member 170 are formed, during the manufacturing. The auxiliary layer 144 is an auxiliary bonding layer that allows the second inductor layer 160 and the sealing member 170 to be more easily bonded to the second substrate 140. As an example, the auxiliary layer 144 is formed of a metal material.

The second filter 150 is formed on the second substrate 140, in the inner space of the bulk-acoustic wave filter device 100 and faces the first filter 120. That is, the first and second filters 150 are spaced apart and face each other between the first and second substrates 110 and 140, in the inner space of the bulk-acoustic wave filter device 100. The second filter 150 includes, for example, a lower electrode (not shown), a piezoelectric layer (not shown), and an upper electrode (not shown). The lower electrode, the piezoelectric layer, and the upper electrode may be sequentially stacked. Further, the second filter 150 may include with an air gap.

The lower electrode and the upper electrode included in the second filter 150 may be formed of a conductive material such as molybdenum (Mo), ruthenium (Ru), or tungsten (W).

Further, the lower electrode and the upper electrode included in the second filter 150 are used as an input electrode and an output electrode for applying electrical signals, such as RF signals, to the piezoelectric layer. For example, when the lower electrode is the input electrode, the upper electrode is the output electrode.

Further, the piezoelectric layer converts the electrical signal input from the lower electrode or the upper electrode into an acoustic wave.

For example, when an electric field varying over time is induced into the lower electrode, the piezoelectric layer converts the electrical signal input to the lower electrode into physical vibrations. That is, when the electric field varying over time is induced into the lower electrode, the piezoelectric layer generates a bulk acoustic wave oriented in the thickness direction in the piezoelectric layer using the induced electric field. Thus, the piezoelectric layer generates the bulk acoustic wave from the electrical signal.

The piezoelectric layer may be formed by depositing aluminum nitride, zinc oxide, or lead zirconate titanate on the lower electrode.

The second inductor layer 160 is formed on the second substrate 140 so as to be disposed around the second filter 150. The second inductor layer 160 may be formed of either of copper (Cu) and nickel (Ni) and may be formed by plating. For example, the second inductor layer 160 is disposed outside of the second filter 150.

In addition, the second inductor layer 160 has a high aspect ratio. That is, a thickness t2 of the second inductor layer 160 is greater than a width w2 of the second inductor layer 160.

Further, the second inductor layer 160 has a spiral shape. For example, the second inductor layer 160 has a shape corresponding to a shape of the second filter 150. For example, when the second filter 150 has a substantially amorphous circular or oval shape, the second inductor layer 150 has a substantially amorphous circular or oval shape. As another example, when the second filter 150 has a substantially polygonal shape (e.g., a pentagon, or a quadrangle), the second inductor layer 160 also has a substantially polygonal shape.

Due to the second inductor layer 160 having the spiral shape, the second inductor layer 160 is not shaped to seal the inner space of the bulk-acoustic wave filter device 100.

In addition, the second inductor layer 160 has a shape corresponding to the shape of the first inductor layer 130. The second inductor layer 160 is bonded to the first inductor layer 130. Further, the first and second inductor layers 130 and 160 may be bonded to each other by eutectic bonding. The first and second inductor layers 130 and 160 combine to form an inductor 190. A width of the inductor 190 is less than a thickness of the inductor 190, thereby improving a quality factor of the inductor 190.

The sealing member 170 seals the inner space in which the first and second filters 120 and 150 are disposed, together with the first and second inductor layers 130 and 160. That is, as shown in FIG. 2, the sealing member 170 is formed in open areas of the first and second inductor layer 130 and 160 to seal the inner space of the bulk-acoustic wave filter device 100, in which the first and second filters 120 and 150 are disposed. The sealing member 170 is formed of a polysilicon material, for example.

The first substrate 110 includes a first bonding layer 119 outside of the first inductor layer 130, and the second substrate 140 includes a similarly configured a second bonding layer (not shown) that is bonded to the first bonding layer 119. The first bonding layer 119 and the second bonding layer (not shown) are components for bonding the first and second substrates 110 and 140 together, and may be formed of a metal material such as gold (Au) or chrome (Cr).

As described above, a quality factor is improved by the inductor 190 formed by the first and second inductor layers 130 and 160 having the high aspect ratio. Additionally, the quality factor is further improved by the etched grooves 114 and 144 formed on the first and second inductor layers 130 and 160, respectively.

In addition, the inner space in which the first and second filters 130 and 160 are formed are sealed by the first and second inductor layers 130 and 160 and the sealing member 170, and therefore form a double sealing structure together with a bonding layer (not shown). That is, it is possible to more certainly prevent moisture and other contaminants from permeating into the inner space in which the first and second filters 130 and 160 are formed.

FIGS. 3 through 12 are explanatory diagrams illustrating a method of manufacturing the bulk-acoustic wave filter device 100, according to an embodiment.

Figure 3:
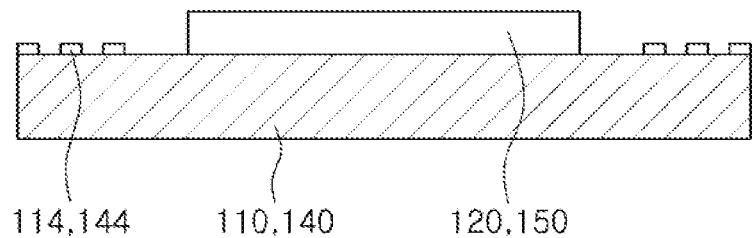
FIGS. 3 through 12 are process diagrams illustrating a method of manufacturing a bulk-acoustic wave filter device, according to an embodiment.

Referring first to FIG. 3, the first and second filters 120 and 150 are formed on the first and second substrates 110 and 140, respectively, and then the auxiliary layers 114 and 144 are formed on the first and second substrates 110 and 140, respectively. The auxiliary layers 114 and 144 are formed to be disposed around the first and second filters 120 and 150, respectively.

Figure 4:
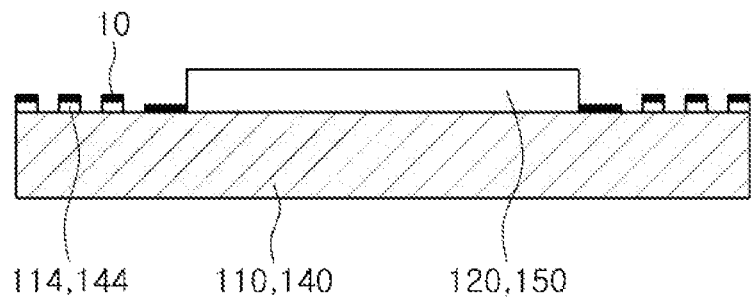

Next, as shown in FIG. 4, mask layers 10 are formed on a portion of the first and second substrates 110 and 140 and the auxiliary layers 114 and 144. The mask layer 10 is formed of a material not affected by photo resist or ion reactive etching (RIE).

Figure 5:
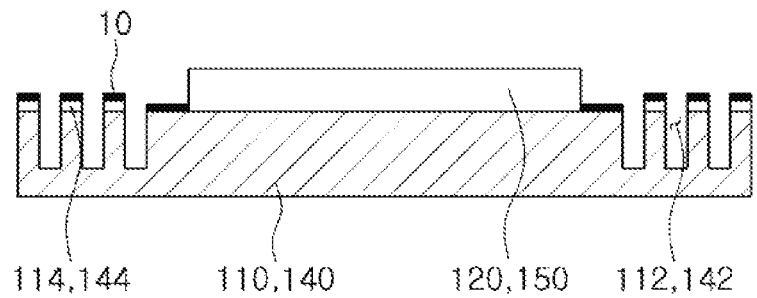

Thereafter, as shown in FIG. 5, the etched grooves 112 and 142 are formed around the auxiliary layers 114 and 144, respectively, by performing the deep trench RIE.

Figure 6:
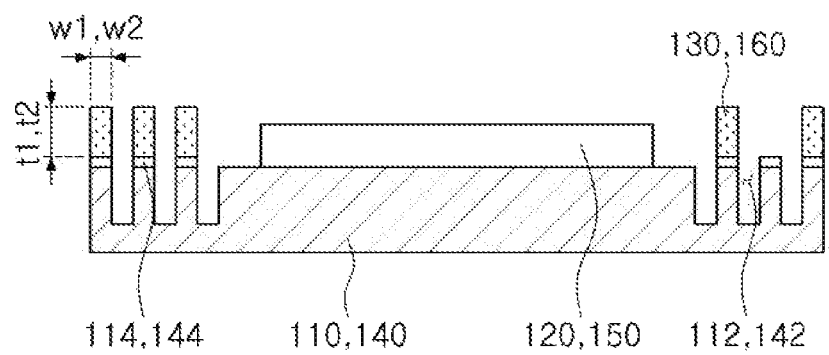

Next, as shown in FIG. 6, after the mask layer 10 is removed, the first and second inductor layers 130 and 160 are formed on the auxiliary layers 114 and 144, respectively, to form the inductor 190 having a high aspect ratio. The first and second inductor layers 130 and 160 have the thicknesses t1 and t2 greater than the respective widths w1 and w2. Further, the first and second inductor layers 130 and 160 are formed of a metal material by the plating.

Figure 7:
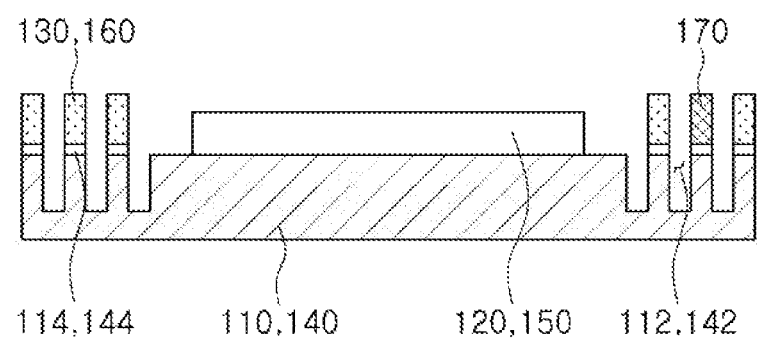

Thereafter, as shown in FIG. 7, the sealing member 170 is formed on portions of the auxiliary layers 114 and 144 on which the first and second inductor layers 130 and 160 are not formed. The sealing member 170 is formed of a material such as polysilicon. As shown in FIG. 2, the sealing member 170 is formed in the open areas of the first and second inductor layers 130 and 160.

Figure 8:
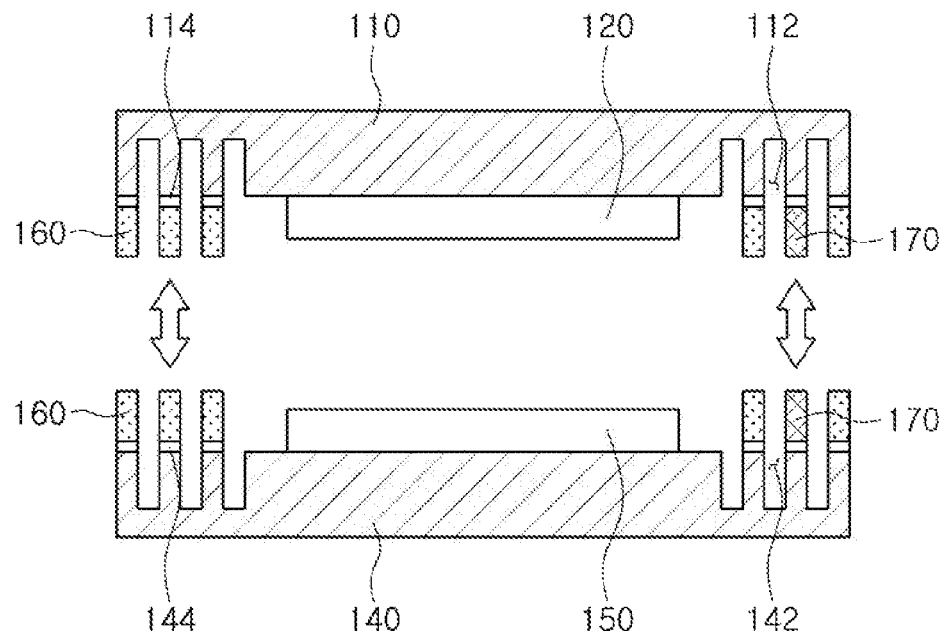
Figure 9:
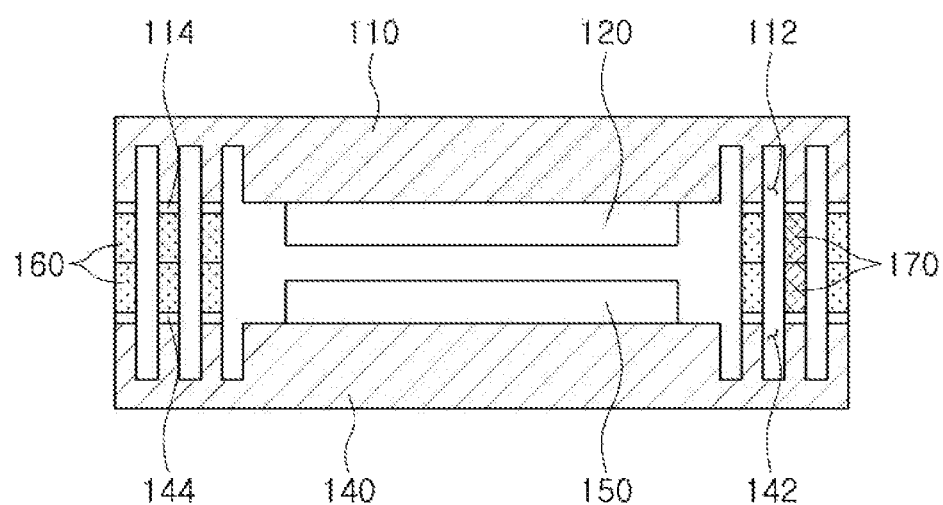

Next, as shown in FIG. 8, the first and second substrates 110 and 140 are stacked together so that the first and second filters 120 and 150 face each other. Thereafter, as shown in FIG. 9, the first and second inductor layers 130 and 160 and the sealing member 170 are bonded to each other by the eutectic bonding.

Figure 10:
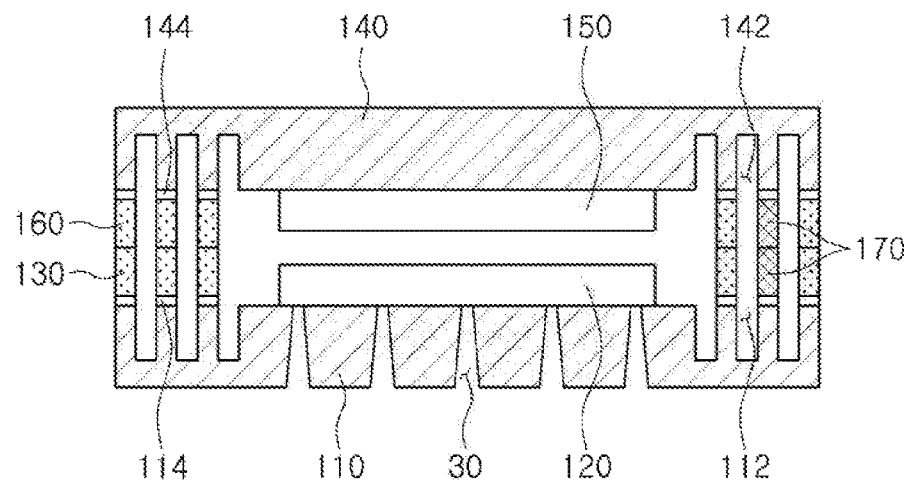
Figure 11:
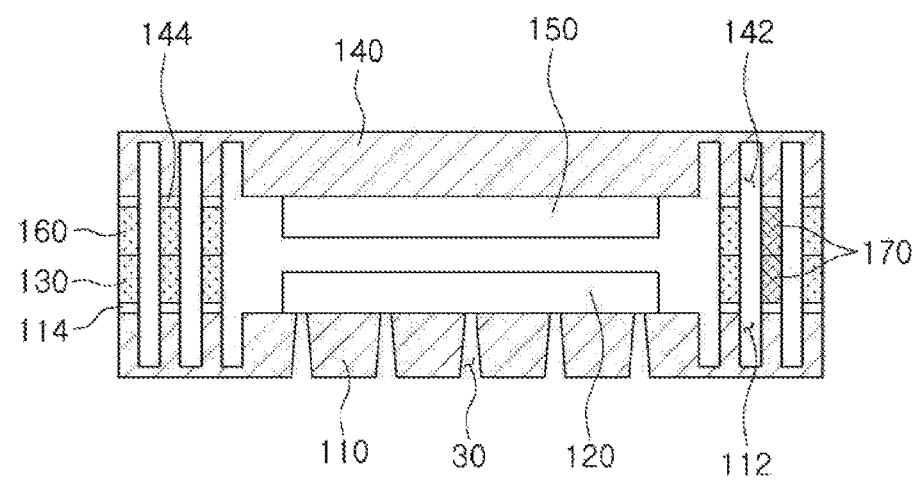

Thereafter, as shown in FIG. 10, etching is performed to form a via hole 30 on the bottom surface of the first substrate 110. Thereafter, as shown in FIG. 11, chemical mechanical polishing (CMP) is performed to reduce the thickness of the bulk-acoustic wave filter device 100.

Figure 12:
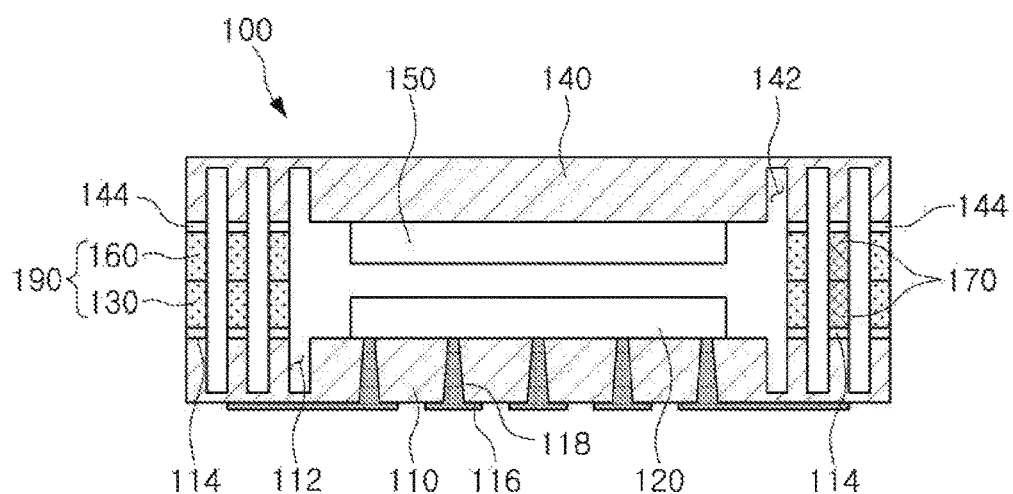

Thereafter, as shown in FIG. 12, the via hole 30 is plated to form the via 118 while simultaneously forming the connection pad 116 on the first substrate 110.

As described above, the first and second inductor layers 130 and 160, and the sealing member 170 are formed around the first and second filters 120 and 150 to seal the space in which the first and second filters 120 and 150 are disposed, thereby improving air-tightness.

As set forth above, according to the embodiments disclosed herein, it is possible to improve the performance of an inductor and block moisture and other contaminants from permeating a bulk-acoustic wave filter device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave filter device, comprising:
a first substrate;
a first filter disposed on the first substrate, within a cavity of the bulk-acoustic wave filter device;
a second substrate coupled to the first substrate;
a second filter disposed on the second substrate, within the cavity and facing the first filter;
a first inductor layer disposed on the first substrate and around the first filter;
a second inductor layer disposed on the second substrate and around the second filter, and bonded to the first inductor layer; and
a sealing member sealing the cavity, together with the first and second inductor layers.

2. The bulk-acoustic wave filter device of claim 1, wherein the first and second substrates comprise etched grooves disposed around the first and second inductor layers.

3. The bulk-acoustic wave filter device of claim 2, wherein the etched grooves are formed by reactive ion etching (RIE).

4. The bulk-acoustic wave filter device of claim 1, wherein the first and second inductor layers comprise either one of copper and nickel, and are formed by plating.

5. The bulk-acoustic wave filter device of claim 4, wherein the first and second inductor layers are bonded to each other by eutectic bonding.

6. The bulk-acoustic wave filter device of claim 1, wherein the first and second substrates comprise auxiliary layers on which the first and second inductor layers and the sealing member are formed.

7. The bulk-acoustic wave filter device of claim 6, wherein the sealing member is disposed on portions of the auxiliary layers on which the first and second inductor layers are not formed.

8. The bulk-acoustic wave filter device of claim 1, wherein the first and second inductor layers comprise spiral shapes corresponding to each other.

9. The bulk-acoustic wave filter device of claim 1, wherein the sealing member is formed in an open area of the first and second inductor layers.

10. The bulk-acoustic wave filter device of claim 1, wherein the sealing member comprises a polysilicon material.

11. The bulk-acoustic wave filter device of claim 1, wherein a thickness of the first and second inductor layers is greater than a width of the first and second inductor layers.

12. The bulk-acoustic wave filter device of claim 1, further comprising a connection pad disposed on a bottom surface of the first substrate and connected to a via.

13. The bulk-acoustic wave filter device of claim 1, further comprising:
 a first bonding layer disposed on the first substrate, outside of the first inductor layer; and
 a second bonding layer disposed on the second substrate and bonded to the first bonding layer.

14. A bulk-acoustic wave filter device, comprising:
 a first substrate;
 a first filter disposed on the first substrate, within a cavity of the bulk-acoustic wave filter device;
 a second substrate coupled to the first substrate;
 a second filter disposed on the second substrate, within the cavity and facing the first filter;
 an inductor comprising a spiral shape and comprising first and second inductor layers enclosing the first and second filters; and
 a sealing member sealing a portion of the inductor so as to seal the cavity.

15. The bulk-acoustic wave filter device of claim 14, wherein the first and second substrates comprise etched grooves disposed around the first and second inductor layers.

16. The bulk-acoustic wave filter device of claim 14, wherein a thickness of the first and second inductor layers is greater than a width of the first and second inductor layers.

17. The bulk-acoustic wave filter device of claim 14, wherein the sealing member comprises a polysilicon material.

18. The bulk-acoustic wave filter of claim 14, wherein the inductor and the sealing member are bonded to the first and second substrates.

* * * * *